United States Patent

Hunter et al.

[11] Patent Number: 6,151,446
[45] Date of Patent: Nov. 21, 2000

[54] APPARATUS AND METHOD FOR THERMALLY PROCESSING SUBSTRATES INCLUDING A PROCESSOR USING MULTIPLE DETECTION SIGNALS

[75] Inventors: Aaron Hunter, Santa Cruz; Mark Yam, San Jose; Abhilash J. Mayur, Salinas, all of Calif.

[73] Assignee: Applied Materials, Inc., Santa Clara, Calif.

[21] Appl. No.: 09/348,147

[22] Filed: Jul. 6, 1999

[51] Int. Cl.[7] .................................................. H01L 21/205
[52] U.S. Cl. ........................ 392/416; 392/418; 219/411; 219/502; 118/725; 374/121
[58] Field of Search ...................... 219/502, 390, 219/405, 411; 392/416, 418; 118/724, 725, 50.1; 374/121, 124, 126–129

[56] References Cited

U.S. PATENT DOCUMENTS

| | | | |
|---|---|---|---|
| 4,969,748 | 11/1990 | Crowley et al. | 374/1 |
| 4,984,902 | 1/1991 | Crowley et al. | 374/1 |
| 5,114,242 | 5/1992 | Gat et al. | 374/128 |
| 5,165,796 | 11/1992 | Gat et al. | 374/128 |
| 5,305,417 | 4/1994 | Najm et al. | 392/418 |
| 5,660,472 | 8/1997 | Peuse et al. | 374/128 |
| 5,690,429 | 11/1997 | Ng | 374/1 |
| 5,704,712 | 1/1998 | Stein | 374/126 |
| 5,755,510 | 5/1998 | Hernandez et al. | 374/121 |
| 5,762,419 | 6/1998 | Yam | 374/2 |
| 5,820,261 | 10/1998 | Yam | 374/2 |
| 5,822,222 | 10/1998 | Kaplinsky et al. | 364/557 |
| 5,874,711 | 2/1999 | Champetier et al. | 219/502 |
| 5,879,128 | 3/1999 | Tietz et al. | 414/757 |

*Primary Examiner*—John A. Jeffery
*Attorney, Agent, or Firm*—Fish & Richardson

[57] ABSTRACT

Apparatus and methods of thermally processing a substrate inside a processing chamber including a radiation source for heating the substrate are described. In one aspect, a detection system is configured to receive radiation from the substrate and to produce first and second detection system signals respectively representative of different first and second spectral portions of the received radiation. A processor is coupled to the detection system and configured to compute a measure of substrate temperature based upon the second detection system signal and to compute an indication of the relative accuracy of the computed measure of substrate temperature based upon the first detection system signal. In another aspect, the substrate is radiatively heated; radiation is received from the substrate and an intensity signal representative of the intensity of the received radiation is produced; an indication of the rate at which the substrate is being heated is computed based upon the intensity signal; and when the substrate is placed onto a substrate support inside the processing chamber is controlled based upon the computed heating rate indication.

57 Claims, 4 Drawing Sheets

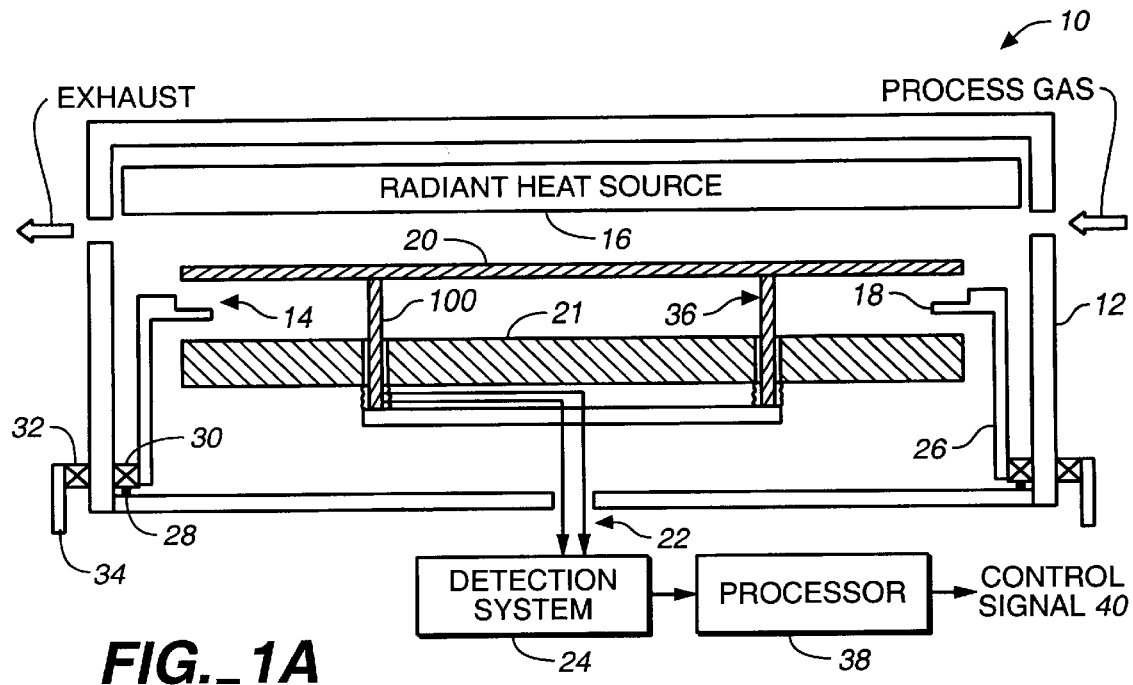
FIG._1A
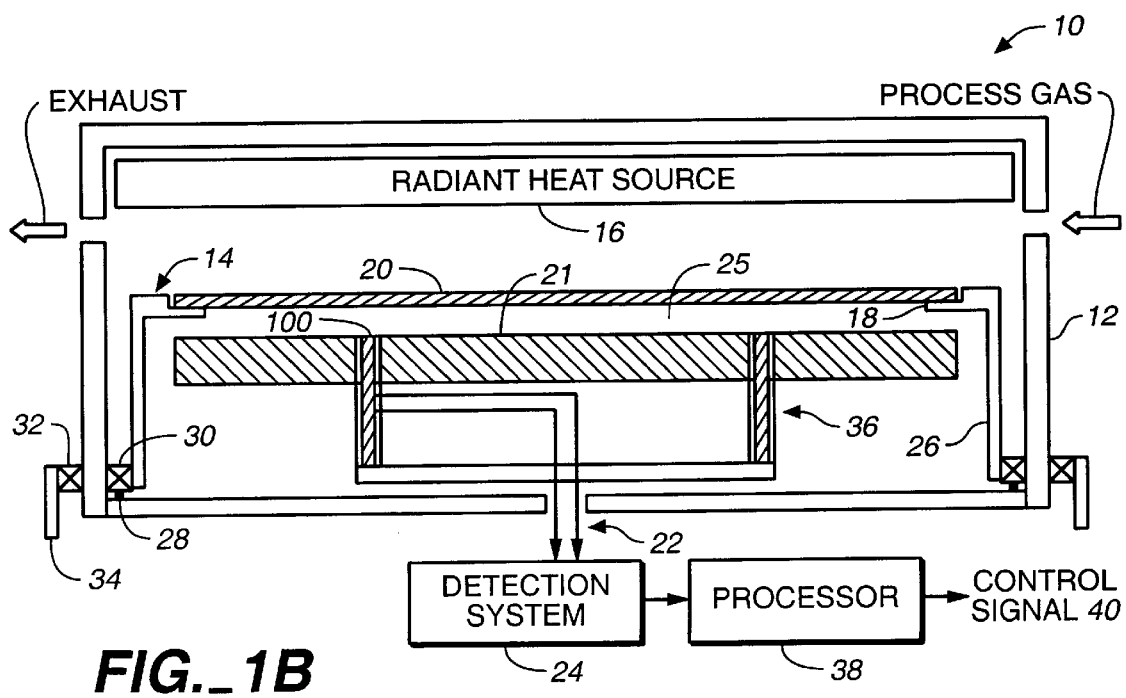
FIG._1B

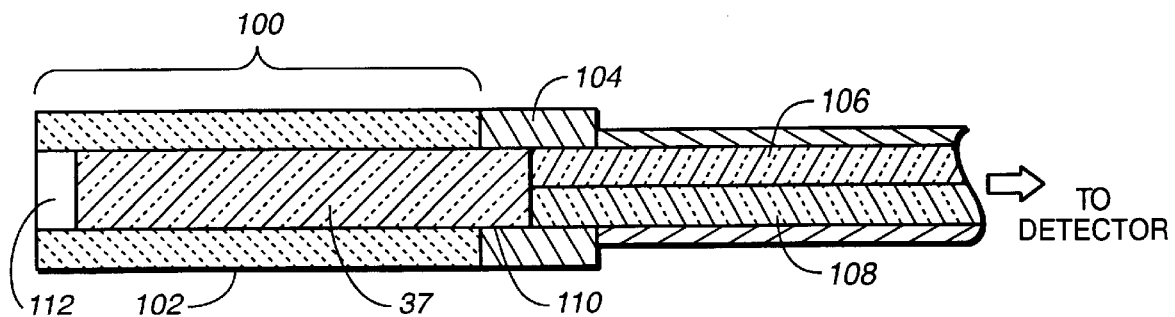
FIG._2
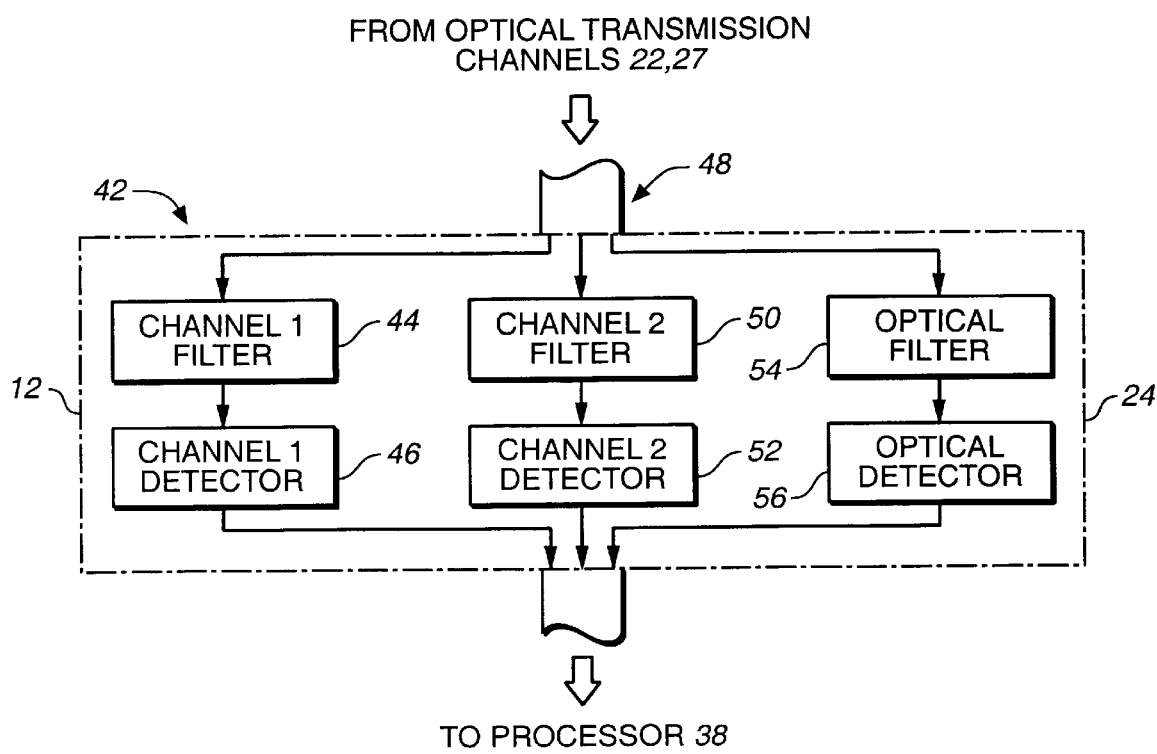
FIG._3

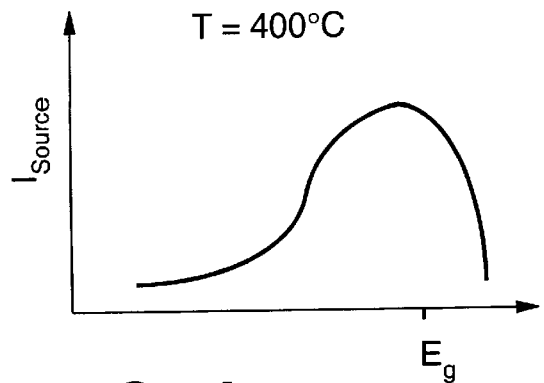
FIG._4
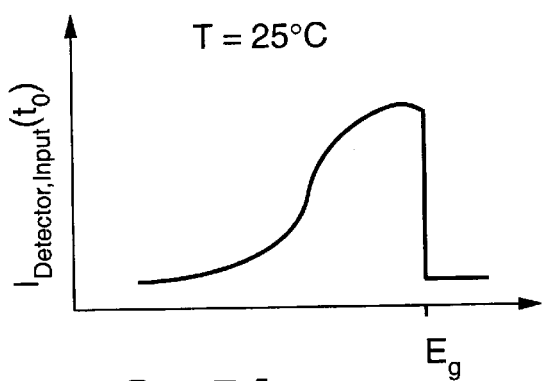
FIG._5A
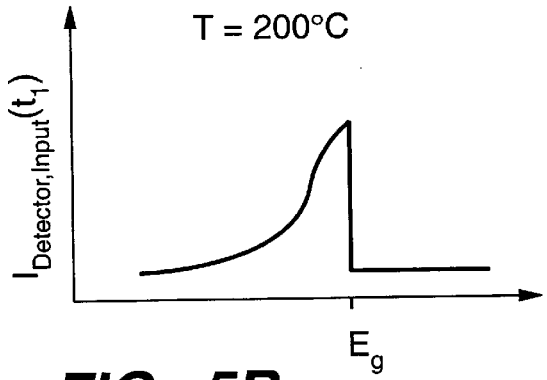
FIG._5B
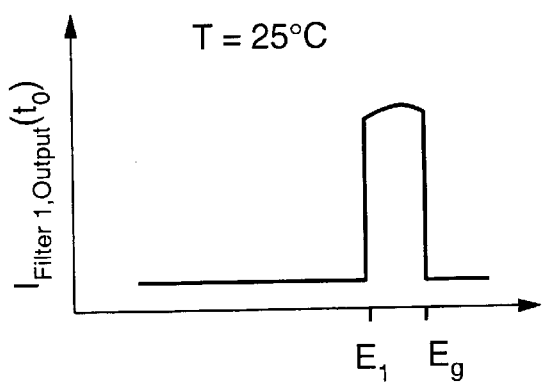
FIG._6A
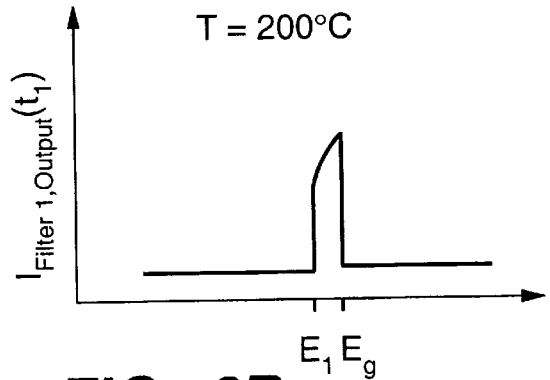
FIG._6B

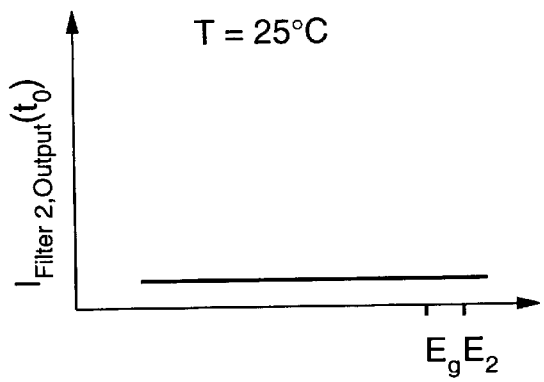
FIG._7A
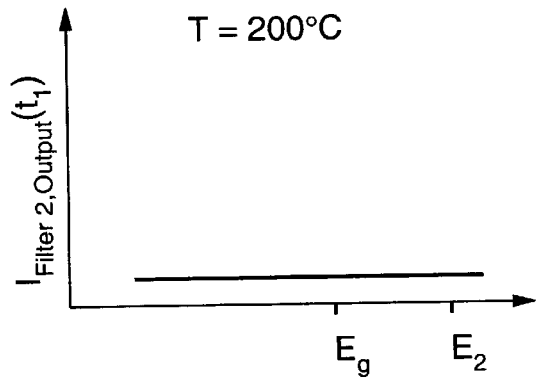
FIG._7B
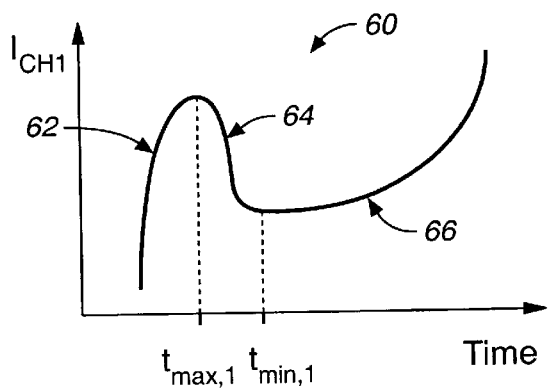
FIG._8A
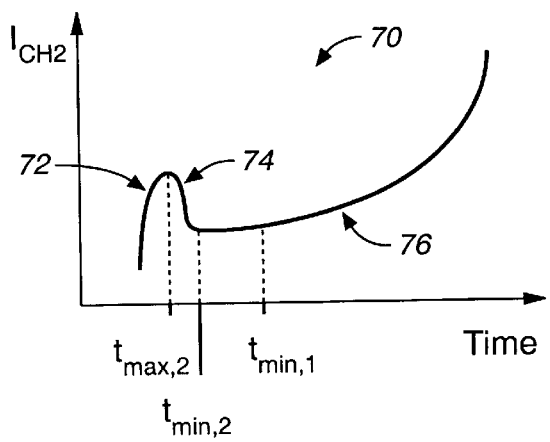
FIG._8B

APPARATUS AND METHOD FOR THERMALLY PROCESSING SUBSTRATES INCLUDING A PROCESSOR USING MULTIPLE DETECTION SIGNALS

BACKGROUND OF THE INVENTION

This invention relates to apparatus and methods of thermally processing substrates.

In most thermal processing methods and apparatus substrate temperatures are precisely measured and controlled over a wide range of temperatures. For example, Peuse et al. (U.S. Pat. No. 5,660,472) describes a rapid thermal processing (RTP) system that includes a plurality of pyrometers configured to measure substrate temperature based upon the radiation emitted from a substrate which is being heated by an array of broad-band radiation sources. At temperatures above 300–325° C., the substrate temperature may be controlled within a desired range by a feedback controller which adjusts the radiation source power based upon signals received from one or more of the pyrometers. At temperatures below about 300–325° C., however, the emission intensity from the substrate within the wavelength range to which the pyrometers are sensitive generally is insufficient for the pyrometers to accurately measure substrate temperature. Contact probes (e.g., thermocouples) may be used to monitor substrate temperatures at lower temperatures. Such direct temperature measurement techniques, however, are difficult to reliably implement because of problems associated with degradation of the contact probe and maintenance of a stable thermal contact between the probe and the substrate.

In general, substrates are thermally processed in a series of one or more phases. For example, some thermal processes include a pre-heating phase during which the substrate is heated to an initial temperature before the substrate is loaded completely into the processing chamber and processed with a prescribed heating cycle.

SUMMARY OF THE INVENTION

The invention features apparatus and methods of thermally processing a substrate inside a processing chamber having a radiation source for heating the substrate that extracts information (e.g., substrate temperature or substrate heating rate) from low temperature (e.g., below 400° C.) pyrometric measurements that may be used to efficiently process substrates.

In one aspect, the invention features a detection system configured to receive radiation from the substrate and to produce first and second detection system signals respectively representative of different first and second spectral portions of the received radiation; and a processor coupled to the detection system and configured to compute a measure of substrate temperature based upon the second detection system signal and to compute an indication of the relative accuracy of the computed measure of substrate temperature based upon the first detection system signal.

In accordance with this aspect, the substrate is radiatively heated; first and second signals respectively representative of different first and second spectral portions of radiation received from the substrate are produced; a measure of substrate temperature is computed based upon the second detection system signal; and an indication of the relative accuracy of the computed measure of substrate temperature is computed based upon the first detection system signal.

In another aspect, the invention features a method of thermally processing a substrate inside a processing chamber, comprising: radiatively heating the substrate; receiving radiation from the substrate and producing an intensity signal representative of the intensity of the received radiation; computing an indication of the rate at which the substrate is being heated based upon the intensity signal; and controlling when the substrate is placed onto a substrate support inside the processing chamber based upon the computed heating rate indication.

Embodiments may include one or more of the following features.

The first and second spectral portions of the radiation transmitted through the optical transmission channel preferably are selected based upon a temperature-responsive optical transmission characteristic of the substrate. For example, the substrate may be characterized by a bandgap energy, the first spectral portion has a first lower energy cutoff that is less than the bandgap energy, and the second spectral portion has a second lower energy cutoff that is greater than the bandgap energy. The detection system may include first and second highpass filters respectively characterized by the first and second lower energy cutoffs. Alternatively, the detection system may include first and second bandpass filters respectively characterized by the first and second lower energy cutoffs.

The optical transmission channel may be defined through a lift pin configured to support the substrate.

The processor preferably is configured to compute the relative accuracy indication based upon changes in the first detection system signal over time. The relative accuracy indication may correspond to the time derivative of the first detection system signal. The processor may be configured to provide an indication of substrate temperature at a time following a peak in the first detection system signal when the computed relative accuracy indication is lower than a threshold value. The processor also may be configured to identify a local maximum and a local minimum in the first detection system signal over time.

The processor preferably is configured to compute an indication of the rate at which the substrate is being heated inside the processing chamber. The heating rate indication may be computed based upon the time separating a local maximum and a local minimum in the first detection signal. The heating rate indication may be computed based upon a local maximum and a subsequent local minimum in the first detection signal. Alternatively, the heating rate indication may be computed based upon a local maximum and a preceding local minimum in the first detection signal. The substrate heating rate indication also may be determined based upon the first detection signal intensity measured at a time following a local maximum in the first detection signal.

The processor preferably is configured to provide a control signal for controlling when the substrate is placed onto a substrate support inside the processing chamber. The processor may be configured to provide a control signal for adjusting the power supplied by the radiation source that is based upon a determination of the rate at which the substrate is being heated inside the processing chamber. The processor may be configured to provide a control signal for placing the substrate onto the substrate support that is based upon a determination of the length of time required to heat the substrate to a desired temperature. The required length of time is determined from a precomputed look-up table or an equation.

Other features and advantages will become apparent from the following description, including the drawings and the claims.

BRIEF DESCRIPTION OF THE DRAWINGS

FIG. 1A is a diagrammatic view of a substrate being loaded into a thermal processing chamber that includes a radiant heat source, a detection system, and a processor.

FIG. 1B is a diagrammatic view of the substrate being supported by an edge ring inside the thermal processing chamber of FIG. 1A.

FIG. 2 is a cross-sectional view of a lift pin through which an optical transmission channel is defined.

FIG. 3 is a diagrammatic view of the components of the detection system of FIG. 1A, including filters and detectors for channels 1 and 2.

FIG. 4 is a graph of the intensity of radiation produced by the radiant heat source of FIG. 1A plotted as a function of energy.

FIGS. 5A and 5B are intensity-energy graphs of the radiation at the input of the detection system of FIG. 1A plotted at times $t_0$ and $t_1$, respectively.

FIGS. 6A and 6B are intensity-energy graphs of the radiation at the output of the channel 1 filter plotted at times $t_0$ and $t_1$, respectively.

FIGS. 7A and 7B are intensity-energy graphs of the radiation at the output of the channel 2 filter plotted at times $t_0$ and $t_1$, respectively.

FIGS. 8A and 8B are intensity-time plots of the signals produced by the channel 1 and channel 2 detectors, respectively.

DETAILED DESCRIPTION

Referring to FIGS. 1A and 1B, a thermal processing apparatus 10 includes a chamber 12 that contains a substrate support 14 and a radiant heat source 16. Substrate support 14 includes a support ring 18 which contacts the peripheral edge of a substrate 20 (e.g., a semiconductor wafer characterized by a temperature-responsive bandgap energy). Support ring 18 contacts only a minor fraction of the bottom surface of substrate 20, leaving a major fraction of the bottom substrate surface exposed to emit radiation toward a reflector 21 and an optical transmission channel 22 (e.g., a light pipe formed from quartz or sapphire) which is coupled to a detection system 24. When substrate 20 is supported by support ring 18, the underside of substrate 20 and the top surface of reflector 21 form a reflecting cavity for enhancing the effective emissivity of substrate 20. Support ring 18 is mounted on a support tube 26 which, in turn, is rotatably supported by a bearing assembly 28. Magnets 30, which are mounted on bearing assembly 28, magnetically couple with magnets 32 which are mounted on a drive ring 34. In operation, drive ring 34 rotates and, by magnetic coupling, causes support tube 26 and support ring 18 to rotate. In an alternative embodiment, bearing assembly 28 and magnets 30, 32 may be replaced by a sealed drive assembly. Chamber 12 is preferably water-cooled.

In operation, radiant heat source 16 heats the interior of chamber 12 to a preheat temperature (e.g., about 300–400° C.). Subsequently, a robot arm moves substrate 20 into chamber 12 through an opening in housing 12. A lift pin assembly 36 rises up from beneath substrate 20, lifts substrate 20 off of the robot arm (at which point the robot arm may be withdrawn from chamber 12), and lowers substrate 20 onto support ring 18. To avoid problems (e.g., substrate warpage and other substrate degradation) that might result from the rapid increase in temperature caused by contact of substrate 20 with the preheated substrate support 14, lift pin assembly 36 holds substrate 20 in a fixed position adjacent to radiant heat source 16 until the temperature of substrate 20 is within a desired temperature range (e.g., 300–350° C.). At this point, substrate 20 may be lowered onto support ring 18 and substrate 20 may be processed (FIG. 1B).

Referring to FIG. 2, lift pin assembly 36 includes a lift pin 100 that is formed from an outer sheath 102 (formed from, e.g., silicon with a thickness of about 2 mm) that surrounds an inner optical transmission channel 37 (e.g., a light pipe formed from quartz or sapphire). A fiber optic coupler 104 optically couples optical transmission channel 37 to a pair of fiber optic cables (or fiber optic bundles) 106, 108, which transmit radiation received by channel 37 to detector 24. The proximal and distal ends 110, 112 of optical transmission channel 37 are polished to improve transmission through the channel. As shown, outer sheath 102 extends beyond distal end 112 of optical transmission channel 37 by a fixed distance (e.g., about 50–100 μm) so that distal end 112 of optical transmission channel 37 does not contact substrate 20. In this way, outer sheath 102 shields optical transmission channel 37 from receiving leakage radiation that is not transmitted through or emitted by substrate 20.

As explained in detail below, detection system 24 is configured to produce signals representative of different spectral portions of the radiation transmitted through optical transmission channel 37. The different spectral portions of the transmitted radiation are selected based upon a temperature-responsive radiation transmission characteristic of substrate 20. For example, if substrate 20 is a semiconductor wafer (e.g., a silicon wafer), it may be characterized by a bandgap energy (direct or indirect) that decreases as the wafer temperature increases. As a general rule of thumb, radiant energy that is greater than the bandgap energy is absorbed by the wafer, whereas lower energy radiation is transmitted through the wafer. A processor 38 is configured to compute from the detection system signals a measure of substrate temperature, an indication of the relative accuracy of the computed measure of substrate temperature, and a measure of the rate at which substrate 20 is heated inside chamber 12. Processor 38 uses this information to produce a signal 40 that controls when substrate 20 is lowered onto support ring 18. In this way, indirect pyrometric temperature measurements may be used to control the low-temperature preheating stage of the thermal process.

Referring to FIG. 3, in an embodiment designed to process semiconductor substrates, detection system 24 includes a first channel 42 (channel 1) that includes a filter 44 and a detector 46, and a second channel 48 (channel 2) that includes a filter 50 and a detector 52. Filter 44 is characterized by a transmission response with a lower energy cutoff ($E_1$) that is less than the bandgap energy ($E_g$) of substrate 20, and filter 50 is characterized by a transmission response with a lower energy cutoff ($E_2$) that is greater than $E_g$. For a 400° C. chamber preheat temperature, the value of $E_1$ is selected to be below $E_g$ by an amount sufficient for radiant heat source radiation to be detected by detector 46 at a temperature of up to about 200° C. and so that, in operation, the output signal of detector 46 passes through a local minimum at a temperature of about 300° C. The value of $E_2$ is selected to be above $E_g$ by an amount sufficient to block substantially all radiant heat source radiation transmitted through substrate 20 at room temperature. Filters 44, 50 may be bandpass filters or highpass filters having lower cutoff energies $E_1$ and $E_2$, respectively. Detectors 46, 52 are configured to produce signals representative of the intensity of the radiation transmitted through filters 44, 50, respectively. In one embodiment, detector 46 is a silicon photodiode and detector 52 is an indium gallium arsenide (InGaAs) photodetector.

Detection system 24 also includes an optical filter 54 and an optical detector 56 (e.g., a silicon photodiode). During substrate processing, signals from detector 56 are converted by processor 38 into substrate temperature values that are used to control radiant heat source 16.

Referring to FIGS. 4–8B, in an idealized illustration of the radiant energy transmission characteristics of optical transmission channel 37, radiant heat source 16 may produce broadband radiation with the characteristic spectral profile shown in FIG. 4. When substrate 20 initially is inserted into chamber 12 (at time $t_0$ with a temperature of 25° C.), substrate 20 absorbs radiant energy that is greater than $E_g$, and transmits radiant energy that is less than $E_g$. Accordingly, the radiant energy transmitted through optical transmission channel 37 may have the profile shown in FIG. 5A. After passing through filter 44 (which has a lower cutoff energy $E_1$ that is less than $E_g$), the radiant energy has the profile shown in FIG. 6A; this radiant energy profile is received by detector 46. At the same time, detector 52 receives the radiant energy profile of FIG. 7A, a profile which is produced as a result of the profile of FIG. 5A passing through filter 50 (which has a lower cutoff energy $E_2$ that is greater than $E_g$).

When the temperature of substrate 20 has increased to about 200° C. (at time $t_1$), $E_g$ has shifted to a lower energy level and the radiant energy transmitted through optical transmission channel 22 may have the profile shown in FIG. 5B. After passing through filter 44 the radiant energy has the profile shown in FIG. 6B; this radiant energy profile is received by detector 46. At the same time, detector 52 receives the radiant energy profile of FIG. 7B, a profile which is produced as a result of the profile of FIG. 5B passing through filter 50.

Plotted as a function of time, the output signal produced by detector 46 (channel 1) is characterized by a profile 60 that includes a increasing first portion 62, a decreasing second portion 64 and an increasing third portion 66 (FIG. 8A). First portion 62 increases sharply as a result of the transmission of radiant energy from radiant heat source 16 through the system to detector 46. Eventually, however, first portion 62 reaches a peak (at time $t_{max,1}$) because the bandgap energy ($E_g$) of substrate 20 has decreased. Second potion 64 extends until the amount of radiation emitted by substrate 20 exceeds the amount of radiant heat source radiation that is transmitted through filter 44 (at time $t_{min,1}$).

Similarly, plotted as a function of time, the output signal produced by detector 52 (channel 2) is characterized by a profile 70 that includes a increasing first portion 72, a decreasing second portion 74 and an increasing third portion 76 (FIG. 8B). First portion 72 increases sharply as a result of the transmission of radiation energy from radiant heat source 16 through the system to detector 52. Although the radiation intensity at the output of filter 50 is shown to be insubstantial in the idealized drawings of FIGS. 7A and 7B, some radiation from heat source 16 actually is detected by detector 52 because of filter imperfections, other non-ideal effects, and the nature of radiation transmission through substrate 20. Eventually, however, first portion 72 reaches a peak (at time $t_{max,2}$) because the bandgap energy ($E_g$) of substrate 20 has decreased by an amount sufficient to make substrate 20 appear opaque to detector 52. Second potion 74 extends until the amount of radiation emitted by substrate 20 exceeds the amount of radiant heat source radiation that is transmitted through filter 50 (at time $t_{min,2}$).

Substrate Temperature Measurements

The intensity-time profile produced by detector 52 (channel 2) is different from the intensity-time profile produced by detector 46 (channel 1) because the upper energy cutoff ($E_1$) of filter 44 (channel 1) is lower than the upper energy cutoff ($E_2$) of filter 50 (channel 2). This feature enables processor 38 to compute an indication of the relative accuracy of substrate temperature measures based upon the signals of detector 46 (channel 1). For example, in one embodiment, processor 38 is configured to identify a local minimum (at time $t_{min,1}$; FIG. 8A) in the output signal of detector 46 following the initial signal peak (at time $t_{max,1}$; FIG. 8A). The initial peak and local minimum may be identified by comparing the time derivative of the detector 46 output signal ($\delta I_{CH1}/\delta t$) against a threshold value ($\Delta_{th}$): the local maximum (peak) and minimum correspond to the output signal values at times when $\delta I_{CH1}/\delta t < \Delta_{th}$. The value of $\Delta_{th}$ may be empirically determined and will depend upon the scale of the intensity-time plot; generally, the value of $\Delta_{th}$ is approximately equal to 0.

After time $t_{min,1}$, it may be assumed that a substantial portion of the output signal of detector 52 (channel 2) is produced by emissions from substrate 20, and only a small fraction of the signal corresponds to radiation produced by radiant heat source 16. Accordingly, processor 38 may compute a measure of the temperature of substrate 20 based upon the output signals of detector 52 (channel 2) that are produced after time $t_{min,1}$. Processor 38 may compute the temperature measure using conventional pyrometric techniques. In this embodiment, after processor 38 determines that the temperature of substrate 20 is within a desired range (e.g., about 350–375° C.), processor 38 may provide a control signal that causes lift assembly 36 to lower substrate 20 onto support ring 18.

After substrate 20 has been lowered onto support ring 18, signals received from optical transmission channel 22 may be used by processor 38 to compute the temperature of substrate 20.

Substrate Heating Rate Measurements

Processor 38 may analyze the output signal of detector 46 (channel 1) in a variety of ways in order to compute control signal 40 which controls when the substrate may be lowered onto support ring 18 inside processing chamber 12.

EXAMPLE 1

As shown in FIG. 8A, processor 38 may compute a measure of the rate at which substrate 20 is being heated inside chamber 12 based upon the time difference ($\Delta t_{CH1,Fall}$) between the local maximum (at time $t_{max,1}$) and the subsequent local minimum (at time $t_{min,1}$). In one thermal processing chamber implementation, $\Delta_{CH1,Fall}$ is on the order of about 1–3 seconds for a preheat temperature of about 300–400° C.

The value of $\Delta t_{CH1,Fall}$ may be used to adjust the radiant power supplied by radiant heat source 16. For example, processor 38 may query the following look-up table to determine the amount by which the radiant heat source power is to be adjusted ($\Delta P$) in order to achieve a desired substrate temperature (e.g., 300–350° C. for a 400° C. chamber preheat temperature) within a prescribed period of time.

| $\Delta t_{CH1,Fall}$ (seconds) | $\Delta P$ (watts) |
| --- | --- |
| 1 | $-\Delta_1$ |
| 2 | 0 |
| 3 | $+\Delta_2$ |

The value of $\Delta_1$, $\Delta_2$ and the granularity of the above table may be determined empirically. For example, power adjustments $\Delta_1$, $\Delta_2$ may be determined based upon detector 46 output intensity-time plots for multiple substrates normalized to the peak intensities (at time $t_{max,1}$). The values of $\Delta_1$, $\Delta_2$ may be selected so that substrates are preheated to a desired temperature (e.g., 300–350° C.) within a fixed period of time (e.g., about 10 seconds).

In an alternative embodiment, the value of $\Delta t_{CH1,Fall}$ may be inserted into an empirically derived equation that maps $\Delta t_{CH1,Fall}$ to the output power of heat source 16 needed to achieve a desired substrate temperature within a prescribed period of time (e.g., 10 seconds). In one implementation, the equation is of the form:

$$P(\Delta t_{CH1,Fall}) = a + b \cdot \Delta t_{CH1,Fall} + c \cdot \Delta t^2_{CH1,Fall}$$

where a, b and c are empirically-determined constants.

EXAMPLE 2

As shown in FIG. 8A, processor 38 may compute a measure of the rate at which substrate 20 is being heated inside chamber 12 based upon the time difference ($\Delta t_{CH1,Fall}$) between the local maximum (at time $t_{max,1}$) and the subsequent local minimum (at time $t_{min,1}$) In one thermal processing chamber implementation, $\Delta t_{CH1,Fall}$ is on the order of about 1–3 seconds for a preheat temperature of about 300–400° C.

The value of $\Delta t_{CH1,Fall}$ may be used to determine the amount of time ($t_{preheat}$) substrate 20 should remain positioned adjacent to radiant heat source 16, which is operated at a fixed power, before being lowered onto support ring 18. For example, processor 38 may query the following look-up table to determine the amount of time ($t_{preheat}$) substrate 20 should remain positioned adjacent to radiant heat source 16 before the substrate temperature is within a desired range (e.g., 300–350° C. for a 400° C. chamber preheat temperature).

| $\Delta t_{1,Fall}$ (seconds) | $t_{preheat}$ (seconds) |
|---|---|
| 1 | $\Delta_1$ |
| 2 | $\Delta_2$ |
| 3 | $\Delta_3$ |

The value of $\Delta_1$, $\Delta_2$, $\Delta_3$ and the granularity of the above table may be determined empirically. For example, preheat times $\Delta_1$, $\Delta_2$, and $\Delta_3$ may be determined based upon detector 46 output intensity-time plots for multiple substrates normalized to the peak intensities (at time $t_{max,1}$).

In an alternative embodiment, the value of $\Delta t_{CH1,Fall}$ may be inserted into an empirically derived equation that maps $\Delta t_{CH1,Fall}$ to the amount of time ($t_{preheat}$) substrate 20 should remain positioned adjacent to radiant heat source 16, which is operated at a fixed power, before being lowered onto support ring 18. In one implementation, the equation is of the form:

$$t_{preheat}(\Delta t_{CH1,Fall}) = a + b \cdot \Delta t_{CH1,Fall} + c \cdot \Delta t^2_{CH1,Fall}$$

where a, b and c are empirically-determined constants.

EXAMPLE 3

As shown in FIG. 8A, processor 38 may compute a measure of the rate at which substrate 20 is being heated inside chamber 12 based upon the difference ($\Delta I_{CH1,Fall}$) between the local maximum (at time $t_{max,1}$) and the output of detector 46 at a fixed time ($\Delta t_{fixed}$) subsequent to $t_{max,1}$.

The value of $\Delta I_{CH1,Fall}$ may be used to adjust the radiant power supplied by radiant heat source 16. For example, processor 38 may query the following look-up table to determine the amount by which the radiant heat source power is to be adjusted ($\Delta P$) in order to achieve a desired substrate temperature (e.g., 300–350° C. for a 400° C. chamber preheat temperature).

| $\Delta I_{CH1,Fall}$ (seconds) | $\Delta P$ (watts) |
|---|---|
| 1 | $-\Delta_1$ |
| 2 | 0 |
| 3 | $+\Delta_2$ |

The value of $\Delta_1$, $\Delta_2$ and the granularity of the above table may be determined empirically. For example, power adjustments $\Delta_1$, $\Delta_2$ may be determined based upon detector 46 output intensity-time plots for multiple substrates normalized to the peak intensities (at time $t_{max,1}$) The values of $\Delta_1$, $\Delta_2$ may be selected so that substrates are preheated to a desired temperature (e.g., 300–350° C.) within a fixed period of time (e.g., about 10 seconds).

In an alternative embodiment, the value of $\Delta I_{CH1,Fall}$ may be inserted into an empirically derived equation that maps $\Delta I_{CH1,Fall}$ to the output power (P) of heat source 16 needed to achieve a desired substrate temperature within a prescribed period of time (e.g., 10 seconds). In one implementation, the equation is of the form:

$$P(\Delta I_{CH1,Fall}) = a + b \cdot \Delta I_{CH1,Fall} + c \cdot \Delta I^2_{CH1,Fall}$$

where a, b and c are empirically-determined constants.

EXAMPLE 4

As shown in FIG. 8A, processor 38 may compute a measure of the rate at which substrate 20 is being heated inside chamber 12 based upon the difference ($\Delta I_{CH1,Fall}$) between the local maximum (at time $t_{max,1}$) and the output of detector 46 at a fixed time ($\Delta t_{fixed}$) subsequent to $t_{max,1}$.

The value of $\Delta I_{CH1,Fall}$ may be used to determine the amount of time ($t_{preheat}$) substrate 20 should remain positioned adjacent to radiant heat source 16, which is operated at a fixed power, before being lowered onto support ring 18. For example, processor 38 may query the following look-up table to determine the amount of time ($t_{preheat}$) substrate 20 should remain positioned adjacent to radiant heat source 16 before the substrate temperature is within a desired range (e.g., 300–350° C. for a 400° C. chamber preheat temperature).

| $\Delta t_{CH1,Fall}$ (seconds) | $t_{preheat}$ (seconds) |
|---|---|
| 1 | $\Delta_1$ |
| 2 | $\Delta_2$ |
| 3 | $\Delta_3$ |

The value of $\Delta_1$, $\Delta_2$, $\Delta_3$ and the granularity of the above table may be determined empirically.

In an alternative embodiment, the value of $\Delta I_{CH1,Fall}$ may be inserted into an empirically derived equation that maps $\Delta I_{CH1,Fall}$ to the amount of time ($t_{preheat}$) substrate 20 should remain positioned adjacent to radiant heat source 16, which is operated at a fixed power, before being lowered onto support ring 18. In one implementation, the equation is of the form:

$$t_{preheat}(\Delta I_{CH1,Fall}) = a + b \cdot \Delta I_{CH1,Fall} + c \cdot \Delta I^2_{CH1,Fall}$$

where a, b and c are empirically-determined constants.

EXAMPLE 5

As shown in FIG. 8A, processor 38 may compute a measure of the rate at which substrate 20 is being heated inside chamber 12 based upon the time difference ($\Delta t_{CH1, Rise}$) between an initial time (at time $t_0$; e.g., the time when substrate 20 contacts a lift pin or when robot arm 36 stops inside processing chamber 12) and the subsequent local maximum (at time $t_{max,1}$). In one thermal processing chamber implementation, $\Delta t_{CH1,Rise}$ is on the order of about 1–2 seconds for a preheat temperature of about 300–400° C.

The value of $\Delta t_{CH1,Rise}$ may be used to adjust the radiant power supplied by radiant heat source 16. For example, processor 38 may query the following look-up table to determine the amount by which the radiant heat source power is to be adjusted ($\Delta P$) in order to achieve a desired substrate temperature (e.g., 300–350° C. for a 400° C. chamber preheat temperature).

| $\Delta t_{CH1,Rise}$ (seconds) | $\Delta P$ (watts) |
|---|---|
| 1.0 | $-\Delta_1$ |
| 1.5 | 0 |
| 2.0 | $+\Delta_2$ |

The value of $\Delta_1$, $\Delta_2$ and the granularity of the above table may be determined empirically. For example, power adjustments $\Delta_1$, $\Delta_2$ may be determined based upon detector 46 output intensity-time plots for multiple substrates normalized to the peak intensities (at time $t_{max,1}$). The values of $\Delta_1$, $\Delta_2$ may be selected so that substrates are preheated to a desired temperature (e.g., 300–350° C.) within a fixed period of time (e.g., about 10 seconds).

In an alternative embodiment, the value of $\Delta t_{CH1,Rise}$ may be inserted into an empirically derived equation that maps $\Delta t_{CH1,Rise}$ to the output power (P) of heat source 16 needed to achieve a desired substrate temperature within a prescribed period of time (e.g., 10 seconds). In one implementation, the equation is of the form:

$$P(\Delta t_{CH1,Rise}) = a + b \cdot \Delta t_{CH1,Rise} + c \cdot \Delta t^2_{CH1,Rise}$$

where a, b and c are empirically-determined constants.

EXAMPLE 6

As shown in FIG. 8A, processor 38 may compute a measure of the rate at which substrate 20 is being heated inside chamber 12 based upon the time difference ($\Delta t_{CH1, Rise}$) between an initial time (at time $t_0$; e.g., the time when substrate 20 contacts a lift pin or when robot arm 36 stops inside processing chamber 12) and the subsequent local minimum (at time $t_{min,1}$). In one thermal processing chamber implementation, $\Delta t_{CH1,Rise}$ is on the order of about 1–2 seconds for a preheat temperature of about 300–400° C.

The value of $\Delta t_{CH1,Rise}$ may be used to determine the amount of time ($t_{preheat}$) substrate 20 should remain positioned adjacent to radiant heat source 16, which is operated at a fixed power, before being lowered onto support ring 18. For example, processor 38 may query the following look-up table to determine the amount of time ($t_{preheat}$) substrate 20 should remain positioned adjacent to radiant heat source 16 before the substrate temperature is within a desired range (e.g., 300–350° C. for a 400° C. chamber preheat temperature).

| $\Delta t_{1,Rise}$ (seconds) | $t_{preheat}$ (seconds) |
|---|---|
| 1.0 | $\Delta_1$ |
| 1.5 | $\Delta_2$ |
| 2.0 | $\Delta_3$ |

The value of $\Delta_1$, $\Delta_2$, $\Delta_3$ and the granularity of the above table may be determined empirically.

For example, preheat times $\Delta_1$, $\Delta_2$, and $\Delta_3$ may be determined based upon detector 46 output intensity-time plots for multiple substrates normalized to the peak intensities (at time $t_{max,1}$).

In an alternative embodiment, the value of $\Delta t_{CH1,Rise}$ may be inserted into an empirically derived equation that maps $\Delta t_{CH1,Rise}$ to the amount of time ($t_{preheat}$) substrate 20 should remain positioned adjacent to radiant heat source 16, which is operated at a fixed power, before being lowered onto support ring 18. In one implementation, the equation is of the form:

$$t_{preheat}(\Delta t_{CH1,Rise}) = a + b \cdot \Delta t_{CH1,Rise} + c \cdot \Delta t^2_{CH1,Rise}$$

where a, b and c are empirically-determined constants.

Other embodiments are within the scope of the claims. For example, although only a single optical transmission channel was shown in connection with the above-described embodiments, additional optical transmission channels may be provided.

What is claimed is:

1. An apparatus for thermally processing a substrate inside a processing chamber having a radiation source for heating the substrate, comprising:
    a detector configured to receive radiation from the substrate and to produce an intensity signal representative of the intensity of the received radiation; and
    a processor configured to compute an indication of the rate at which the substrate is being heated based upon the intensity signal and to control when the substrate is placed onto a substrate support inside the processing chamber based upon the computed heating rate indication.

2. An apparatus for thermally processing a substrate inside a processing chamber having a radiation source for heating the substrate, comprising:
    detection means for receiving radiation from the substrate and producing first and second detection signals respectively representative of different first and second spectral portions of the received radiation; and
    processing means coupled to the detection system for computing a measure of substrate temperature based upon the second detection system signal and for computing an indication of the relative accuracy of the computed measure of substrate temperature based upon the first detection system signal.

3. An apparatus for thermally processing a substrate characterized by a bandgap energy inside a processing chamber having a radiation source for heating the substrate, comprising:
    a detection system configured to receive radiation from the substrate and to produce first and second detection system signals respectively representative of different first and second spectral portions of the received radiation, the first spectral portion having a first upper energy cutoff that is less than the bandgap energy of the substrate, and the second spectral portion having a second upper energy cutoff that is greater than the bandgap energy of the substrate; and a processor coupled to the detection system and configured to compute a measure of substrate temperature based upon the second detection system signal and to compute an indication of the relative accuracy of the computed measure of substrate temperature based upon the first detection system signal.

4. A method of thermally processing a substrate inside a processing chamber, comprising:

radiatively heating the substrate;

producing first and second signals respectively representative of different first and second spectral portions of radiation received from the substrate;

computing a measure of substrate temperature based upon the second detection system signal; and computing an indication of the relative accuracy of the computed measure of substrate temperature based upon the first detection system signal.

5. The method of claim 4, wherein the relative accuracy indication is computed based upon changes in the first detection system signal over time.

6. The method of claim 5, wherein the computed relative accuracy indication corresponds to the time derivative of the first detection system signal.

7. The method of claim 4, further comprising providing an indication of substrate temperature at a time following a peak in the first detection system signal when the computed relative accuracy indication is lower than a threshold value.

8. The method of claim 4, further comprising identifying a local maximum in the first detection system signal over time.

9. The method of claim 4, further comprising identifying a local minimum in the first detection signal over time.

10. The method of claim 4, further comprising computing an indication of the rate at which the substrate is being heated inside the processing chamber.

11. The method of claim 10, wherein the heating rate indication is computed based upon the time separating a local maximum and a local minimum in the first detection signal.

12. The method of claim 11, wherein the heating rate indication is computed based upon a local maximum and a subsequent local minimum in the first detection signal.

13. The method of claim 11, wherein the heating rate indication is computed based upon a local maximum and a preceding local minimum in the first detection signal.

14. The method of claim 10, wherein the substrate heating rate indication is determined based upon the first detection signal intensity measured at a time following a local maximum in the first detection signal.

15. The method of claim 4, further comprising providing a control signal for controlling when the substrate is placed onto a substrate support inside the processing chamber.

16. The method of claim 15, wherein the provided control signal adjusts the power supplied by the radiation source and is based upon a determination of the rate at which the substrate is being heated inside the processing chamber.

17. The method of claim 16, wherein the substrate heating rate is determined based upon the time separating a local maximum and a local minimum in the first detection signal.

18. The method of claim 16, wherein the substrate heating rate is determined based upon the first detection signal intensity measured at a time following a local maximum in the first detection signal.

19. The method of claim 16, wherein the substrate heating rate is determined based upon the time separating an initial time and a local maximum in the first detection signal.

20. The method of claim 15, wherein the provided control signal causes the substrate to be placed onto the substrate support and is based upon a determination of the length of time required to heat the substrate to a desired temperature.

21. The method of claim 20, wherein the required length of time is determined from a precomputed look-up table.

22. The method of claim 20, wherein the required length of time is determined from an equation.

23. A method of thermally processing a substrate inside a processing chamber, comprising:

radiatively heating the substrate;

receiving radiation from the substrate and producing an intensity signal representative of the intensity of the received radiation;

computing an indication of the rate at which the substrate is being heated based upon the intensity signal; and controlling when the substrate is placed onto a substrate support inside the processing chamber based upon the computed heating rate indication.

24. The method of claim 23, wherein the heating rate indication is computed based upon a local maximum and a subsequent local minimum in the intensity signal.

25. The method of claim 23, wherein the heating rate indication is computed based upon a local maximum and a preceding local minimum in the intensity signal.

26. The method of claim 23, wherein the substrate heating rate indication is determined based upon the intensity signal measured at a time following a local maximum in the intensity signal.

27. The method of claim 23, wherein when the substrate is placed onto the substrate support is controlled by adjusting the power supplied by the radiation source.

28. The method of claim 23, wherein the substrate heating rate indication is computed based upon the time separating a local maximum and a local minimum in the intensity signal.

29. The method of claim 23, wherein the substrate heating rate indication is computed based upon the intensity signal measured at a time following a local maximum in the intensity signal.

30. The method of claim 23, wherein the substrate heating rate indication is computed based upon the time separating an initial time and a local maximum in the intensity signal.

31. The method of claim 30, wherein the required length of time is determined from a precomputed look-up table.

32. The method of claim 30, wherein the required length of time is determined from an equation.

33. The method of claim 23, wherein controlling when the substrate is placed onto the substrate support includes determining the length of time required to heat the substrate to a desired temperature.

34. An apparatus for thermally processing a substrate inside a processing chamber having a radiation source for heating the substrate, comprising:

a detection system configured to receive radiation from the substrate and to produce first and second detection system signals respectively representative of different first and second spectral portions of the received radiation; and a processor coupled to the detection system and configured to compute a measure of substrate temperature based upon the second detection system signal and to compute an indication of the relative accuracy of the computed measure of substrate temperature based upon the first detection system signal.

35. The apparatus of claim 34, wherein the first and second spectral portions of the radiation are selected based upon a temperature-responsive optical transmission characteristic of the substrate.

36. The apparatus of claim 35, wherein the substrate is characterized by a bandgap energy, the first spectral portion has a first lower energy cutoff that is less than the bandgap energy, and the second spectral portion has a second lower energy cutoff that is greater than the bandgap energy.

37. The apparatus of claim 36, wherein the detection system includes first and second highpass filters respectively characterized by the first and second lower energy cutoffs.

38. The apparatus of claim 36, wherein the detection system includes first and second bandpass filters respectively characterized by the first and second lower energy cutoffs.

39. The apparatus of claim 34, further including an optical transmission channel defined though a lift pin configured to support the substrate wherein the radiation is received by the detection system via the optical transmission channel.

40. The apparatus of claim 34, wherein the processor is configured to compute the relative accuracy indication based upon changes in the first detection system signal over time.

41. The apparatus of claim 40, wherein the relative accuracy indication corresponds to the time derivative of the first detection system signal.

42. The apparatus of claim 34, wherein the processor is configured to provide an indication of substrate temperature at a time following a peak in the first detection system signal when the computed relative accuracy indication is lower than a threshold value.

43. The apparatus of claim 34, wherein the processor is configured to identify a local maximum in the first detection system signal over time.

44. The apparatus of claim 34, wherein the processor is configured to identify a local minimum in the first detection signal over time.

45. The apparatus of claim 34, wherein the processor is configured to compute an indication of the rate at which the substrate is being heated inside the processing chamber.

46. The apparatus of claim 45, wherein the heating rate indication is computed based upon the time separating a local maximum and a local minimum in the first detection signal.

47. The apparatus of claim 46, wherein the heating rate indication is computed based upon a local maximum and a subsequent local minimum in the first detection signal.

48. The apparatus of claim 46, wherein the heating rate indication is computed based upon a local maximum and a preceding local minimum in the first detection signal.

49. The apparatus of claim 45, wherein the substrate heating rate indication is determined based upon the first detection signal intensity measured at a time following a local maximum in the first detection signal.

50. The apparatus of claim 34, wherein the processor is configured to provide a control signal for controlling when the substrate is placed onto a substrate support inside the processing chamber.

51. The apparatus of claim 50, wherein the processor is configured to provide a control signal for adjusting the power supplied by the radiation source that is based upon a determination of the rate at which the substrate is being heated inside the processing chamber.

52. The apparatus of claim 51, wherein the substrate heating rate is determined based upon the time separating a local maximum and a local minimum in the first detection signal.

53. The apparatus of claim 51, wherein the substrate heating rate is determined based upon the first detection signal intensity measured at a time following a local maximum in the first detection signal.

54. The apparatus of claim 51, wherein the substrate heating rate is determined based upon the time separating an initial time and a local maximum in the first detection signal.

55. The apparatus of claim 50, wherein the processor is configured to provide a control signal for placing the substrate onto the substrate support that is based upon a determination of the length of time required to heat the substrate to a desired temperature.

56. The apparatus of claim 55, wherein the required length of time is determined from a precomputed look-up table.

57. The apparatus of claim 55, wherein the required length of time is determined from an equation.

* * * * *